United States Patent
Moldsvor et al.

(10) Patent No.: US 8,344,803 B2
(45) Date of Patent: *Jan. 1, 2013

(54) VARIABLE GAIN AMPLIFIER

(75) Inventors: Oystein Moldsvor, Tiller (NO); Terje Nortvedt Andersen, Trondheim (NO)

(73) Assignee: Hittite Microwave Norway AS, Tiller (NO)

( * ) Notice: Subject to any disclaimer, the term of this patent is extended or adjusted under 35 U.S.C. 154(b) by 0 days.

This patent is subject to a terminal disclaimer.

(21) Appl. No.: 12/740,540

(22) PCT Filed: Oct. 23, 2008

(86) PCT No.: PCT/IB2008/003842
§ 371 (c)(1),
(2), (4) Date: Jun. 25, 2010

(87) PCT Pub. No.: WO2009/083796
PCT Pub. Date: Jul. 9, 2009

(65) Prior Publication Data
US 2010/0264989 A1  Oct. 21, 2010

Related U.S. Application Data

(60) Provisional application No. 60/986,648, filed on Nov. 9, 2007.

(51) Int. Cl.
*H03F 3/45* (2006.01)
(52) U.S. Cl. ..................... 330/254; 330/258
(58) Field of Classification Search ............ 330/254, 330/258; 327/359
See application file for complete search history.

(56) References Cited

U.S. PATENT DOCUMENTS

| | | | |
|---|---|---|---|
| 3,916,333 A | 10/1975 | Zuk | |
| 6,278,321 B1 | 8/2001 | Franck | |
| 6,356,152 B1 | 3/2002 | Jezdic et al. | |
| 6,369,658 B1 | 4/2002 | Nilson | |
| 6,566,951 B1 | 5/2003 | Merrigan et al. | |
| 6,583,667 B1 | 6/2003 | Dasgupta et al. | |
| 6,734,736 B2 * | 5/2004 | Gharpurey | 330/254 |
| 7,202,738 B1 | 4/2007 | Huijsing et al. | |
| 7,688,144 B2 * | 3/2010 | Lee | 330/254 |
| 2003/0122622 A1 | 7/2003 | Gharpurey | |
| 2004/0027200 A1 | 2/2004 | Ashby et al. | |
| 2004/0174199 A1 | 9/2004 | Simon | |

(Continued)

FOREIGN PATENT DOCUMENTS

EP   1686686 A1   8/2006

(Continued)

OTHER PUBLICATIONS

International Search Report for related international application No. PCT/IB2008/003842, report dated Mar. 11, 2009.

(Continued)

*Primary Examiner* — Steven J Mottola

(74) *Attorney, Agent, or Firm* — Rajesh Vallabh; Foley Hoag LLP

(57) ABSTRACT

A variable gain amplifier (VGA) disclosed herein includes an input current connector, an output current connector, a gain adjustment connector, scaled current mirrors copying the input current, means for steering the copied currents either to the current output or to another appropriate location based on the signal present at the gain adjustment connector.

6 Claims, 4 Drawing Sheets

104

U.S. PATENT DOCUMENTS

| | | |
|---|---|---|
| 2004/0203553 A1 | 10/2004 | Toyota et al. |
| 2007/0096814 A1 | 5/2007 | Chiu |

FOREIGN PATENT DOCUMENTS

| | | |
|---|---|---|
| FR | 2 687 865 A1 | 8/1993 |
| FR | 2 756 436 A1 | 5/1998 |
| GB | 2 137 039 A | 9/1984 |

OTHER PUBLICATIONS

Sang-Sao Lee, et al.: "A BiCMOS Continuous-Time Filter for Video Signal Processing Applications" IEEE Journal of Solid-State Circuits, IEEE Service Center, Piscataway, NJ, US, vol. 33, No. 9; Sep. 1, 1998, XP011060805ISSN: 0018-9200; figures 11, 18.

* cited by examiner

VARIABLE GAIN AMPLIFIER

This application is a U.S. National Stage filing under 35 U.S.C. §371 of International Patent Application No. PCT/IB2008/003842 filed on Oct. 23, 2008, which claims priority to U.S. Provisional Application Ser. No. 60/986,648 filed on Nov. 9, 2007.

BACKGROUND

1. Technical Field

A variable gain amplifier is disclosed for signal compensation.

2. Description of the Related Art

In different types of radar, sonar and ultrasound systems a variable gain amplifier is employed for signal compensation. In all these systems, a pulse is emitted from some type of transducer, echoes of the pulse from various objects are detected by the transducer, and the distance to the object is calculated as the pulse speed in the medium times the time from pulse emission to detection. However, as the pulse travels in the medium, the pulse is attenuated, therefore the echo strength will be lower for echoes arriving a long time after pulse emission compared to echoes that arriving earlier.

A variable gain amplifier (VGA) is used to compensate for this effect. The compensation is controlled such that amplification is increased with time with the same amount as the signal is attenuated. In this way the relative signal power at the output of the VGA can be kept constant.

Previously, VGA functionality is most often implemented by using a variable attenuator. The echo signal is first attenuated with a variable attenuator and after passing through the attenuator, and the signal is then amplified to yield the specified total amplification. A typical prior art solution is shown in FIG. 1. The operation of the VGA disclosed in FIG. 1 is based upon providing voltage division using resistors and transistors shown at 12. In FIG. 1, the input resistor $R_I$ is a fixed resistor. The transistors 12 between the right side of $R_I$ and $V_{CM}$ form a variable resistance. The attenuation provided by this voltage division arrangement is dependent on the ratio between $R_I$ and the variable resistance formed by the transistors 12. Amplifiers $A_1$ to $A_{10}$ control the gate voltage of the transistors 12. These voltages are generated such a way that each of the transistors 12 switches on smoothly. The difference between the threshold voltages $V_1$ to $V_{10}$ is optimized together with the shape of the transition of the gate voltages to ensure a VGA gain curve that is as smooth as possible.

One important problem with using such voltage division based VGA is that the signal attenuation and the consecutive amplification results in an increased noise contribution from the VGA. Therefore, there is a need for and improved VGA design.

SUMMARY OF THE DISCLOSURE

A variable gain amplifier (VGA) disclosed herein includes an input current connector, an output current connector, a gain adjustment connector, scaled current mirrors copying the input current, and a means for steering the copied currents either to the current output or to another appropriate location based on the signal present at the gain adjustment connector.

In a refinement, a voltage to current converter may be provided at the input, and a current to voltage converter may be provided at the output.

Other advantages and features will be apparent from the following detailed description when read in conjunction with the attached drawings.

BRIEF DESCRIPTION OF THE DRAWINGS

For a more complete understanding of the disclosed methods and apparatuses, reference should be made to the embodiment illustrated in greater detail on the accompanying drawings, wherein.

It should be understood that the drawings are not necessarily to scale and that the disclosed embodiments are sometimes illustrated diagrammatically and in partial views. In certain instances, details which are not necessary for an understanding of the disclosed embodiments or which render other details difficult to perceive may have been omitted. It should be understood, of course, that this disclosure is not limited to the particular embodiments illustrated herein.

DETAILED DESCRIPTION OF THE PRESENTLY PREFERRED EMBODIMENTS

Figure 1:
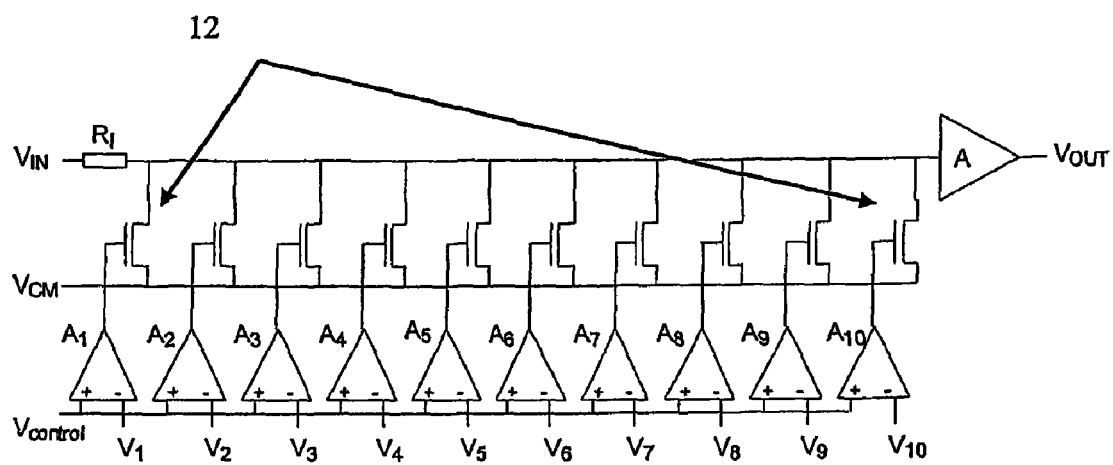
FIG. 1 is a schematic circuit diagram of a prior art implementation of a VGA.
Figure 2:
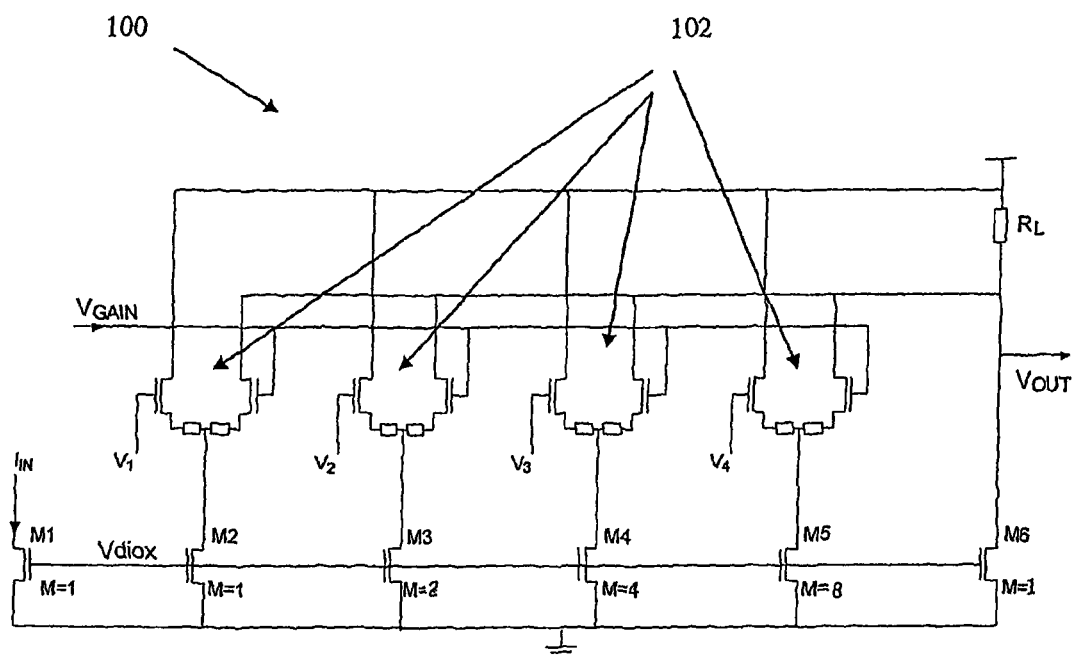
FIG. 2 is a schematic circuit diagram of an embodiment of the disclosed VGA.

The operation of the variable gain amplifier (VGA) based on implementing gain adjustment in the current domain is illustrated in the embodiment disclosed herein. FIG. 2 shows a simplified schematic circuit diagram 100 of a single ended implementation of the gain adjustment. While the circuit diagram 100 discloses a VGA configuration using a particular set of transistor ratios and current summation, it will be noted that multiple different configurations are possible by altering the transistor ratios and how the current is summed into the load resistor $R_L$. The input signal to the VGA 100 in FIG. 2 takes the form of an input current $I_{IN}$. In an embodiment, the gain adjustment circuitry of the VGA 100 may be combined with a voltage to current converter or a trans-conductor to allow for a voltage input to the VGA. The operation of the circuitry is as follows.

The input current $I_{IN}$ is mirrored by transistors M1 to M6. The size of each transistor is designed relative to M1 by the scaling factor M=x such that the current in each of the transistors M2 to M8 are x times the current in M1. Output currents from transistor M2 to M6 are summed into a load resistor $R_L$, and the current gain is defined as the current flowing through $R_L$ divided by $I_{IN}$. The current from transistors M2 to M5 are connected through differential pairs 102, which, based on the control voltage $V_{GAIN}$, either steers the current through the load resistor $R_L$ or directly to the supply voltage. $V_1$ to $V_4$ are threshold voltages used to determine when each differential pair is switched on.

For example, $V_1$ to $V_4$ may be at different voltages with a few hundred millivolts between each tap. The operation of each differential pair 102 will depend on whether that differential pair is source degenerated or not. The size of the resistors at the emitter of any given differential pairs 102 will determine the voltage range of $V_{GAIN}$ required to turn the given differential pair 102 completely on or off.

For example, assume that a given input current is applied to M1 and that $V_{GAIN}$ is set to zero. Also assume that $V_1$ to $V_4$ are set at increasing the voltage potential with $V_1$ by a few hundred millivolts. In this setup, all current from M2 through M5 will be steered directly to the supply voltage. The current through M1 will be mirrored by M6 and will be flowing through $R_L$ resulting in a current gain of one (1) assuming ideal transistors with the scaling factor shown in FIG. 2. If a dynamic signal is applied to $I_{IN}$, the signal current will be amplified with a unity gain.

If $V_{GAIN}$ is increased, part of the M2 current will start flowing in the load resistor $R_L$, thus gradually increasing the current gain. As the differential pair above M2 is fully switched on, the increased current gain will be set by the sum of the scaling factors of M6 and M2, which, in the implementation shown in FIG. 2 is two (2). When $V_{GAIN}$ reaches $V_2$, part of the M3 current will also be steered through $R_L$, and therefore increasing the gain further. Thus, by proper dimensioning of threshold voltages and characteristics of the differential pairs 102, the gain can be smoothly adjusted in a range determined by the current mirror scaling factors. The embodiment in FIG. 2 shows a linear-in-dB gain which means that gain increases exponentially with control voltage. However, alternate characteristics may be achieved by different current mirror scaling.

In FIG. 2, the transistor M6 is connected directly to the load resistor $R_L$. This is one configuration that provides a fixed gain with a small amount of variable gain. In an alternate embodiment, a differential pair 102 may be included in the M6 branch as well. Similarly, the number of branches can also be scaled if different gain ranges or different behavior is required.

In an alternative embodiment, the differential pairs 102 may be controlled differentially by generating non-inverting and inverting control voltages and applying them to both sides of each differential pairs 102. Instead of terminating the current in resistor RL, in yet another embodiment, the signal may be kept in the current domain for further processing.

Figure 3:
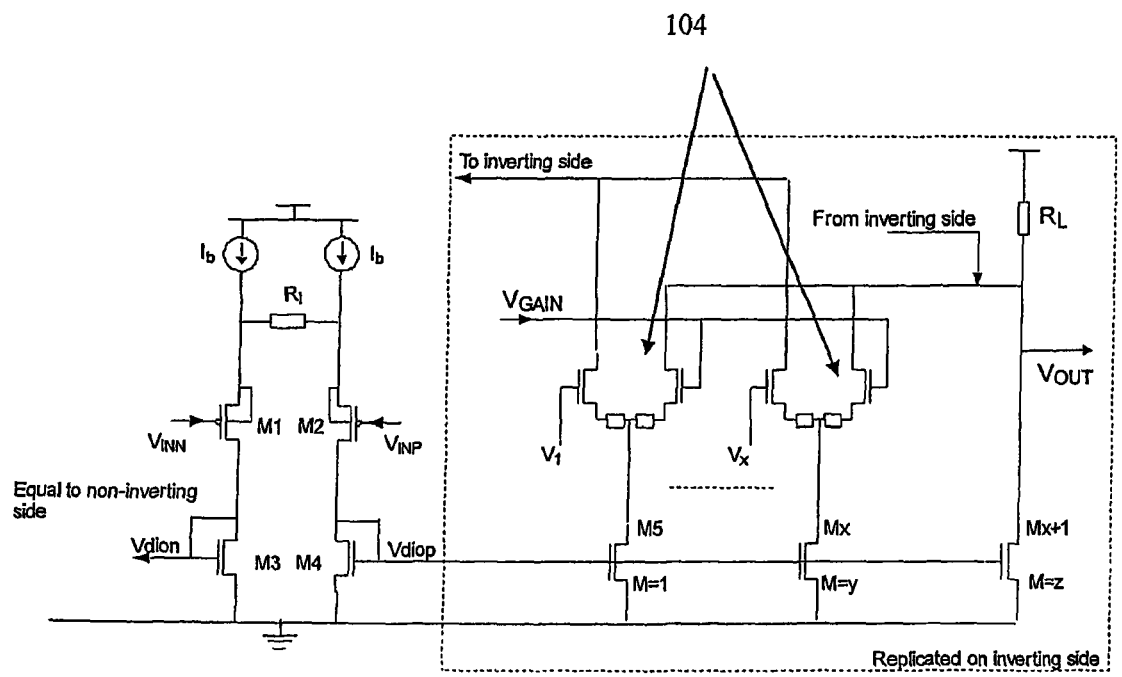
FIG. 3 is a detailed schematic circuit diagram of a disclosed differential implementation of a full VGA.

FIG. 3 illustrates an alternate differential implementation of the VGA. In this implementation, transistors M1 to M4 form a differential voltage to the current converter. The currents through M3 and M4 are mirrored in inverting and non-inverting side circuitries respectively. The differential pairs 104 are either steering the current through the inverting side load resistor or the non-inverting side load resistor whereby the gain is adjusted. The number of current sources in the mirror can be set arbitrarily depending on required gain control range. In an alternate embodiment, it would be also possible to set negative gain factors if $M_{x+1}$ is smaller than the total size of transistors M5 to $M_x$.

Figure 4:
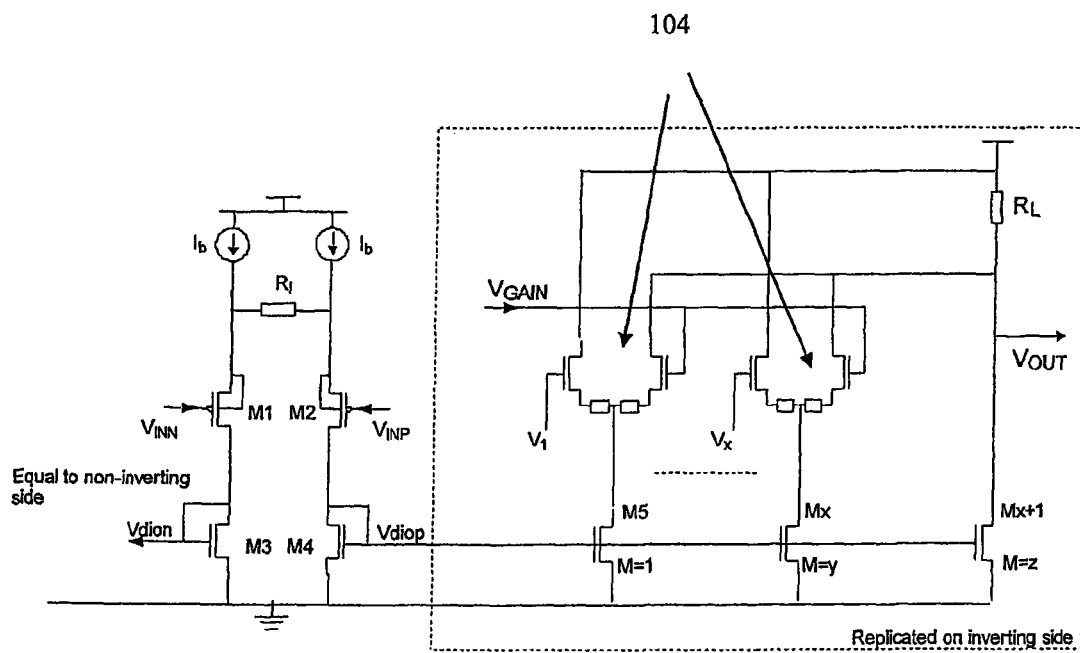
FIG. 4 illustrates an alternate embodiment of the disclosed VGA.

FIG. 4 illustrates an alternate implementation of the VGA having two additional features giving significant advantages and reduction in power dissipation. In this implementation, when the voltage in $V_{GAIN}$ is low, all current from current sources M5 to $M_x+_1$ are conducted directly to the supply, and therefore, these currents do not have any function in the circuit. It is therefore possible to add functionality to switch off the currents that are conducted directly to the supply voltage to reduce the average power dissipation. This, for example, may be accomplished with switches connected in series with the current sources (M5 to $M_x+_1$).

In some instances a common mode feedback loop can be advantageous. When using the connection shown in FIG. 4, the current through the load resistor $R_L$, is dependent on the total gain or equivalently the voltage at $V_{GAIN}$. At high gains this becomes a problem as the bias current in the voltage to current converter is multiplied and therefore saturates the output stage even with no signal at the input. Assuming that the voltage swing at the output should be kept constant, the equivalent input full scale range will be dependent on the total gain. This means that the bias current in the input stage, should be reduced when the gain is increased. This would be equivalent to reducing the current $I_b$ at high gain.

A very efficient implementation of this bias current adjustment is to measure the output common mode voltage $$((V_{OUT}(positive)+V_{OUT}(inverting))/2),$$

and control the $I_b$ current, or another appropriate bias current, to keep the output common mode voltage constant.

While only certain embodiments have been set forth, alternatives and modifications will be apparent from the above description to those skilled in the art. These and other alternatives are considered equivalents and within the spirit and scope of this disclosure and the appended claims.

What is claimed:

1. A variable gain amplifier comprising:
   an input connector;
   an output connector;
   a gain adjustment connector;
   scaled current mirrors copying input current from the input connector;
   a steering mechanism adapted to steer the copied current to at least one of the output connector and another appropriate location based on the signal present at the gain adjustment connector, wherein the steering mechanism comprises a plurality of differential pairs, each operatively coupled to a different one of the scaled current mirrors, and wherein different threshold reference voltages are provided to each of the differential pairs to enable them to be switched on one by one with increasing gain control voltage at the gain adjustment connector;
   a voltage to current converter provided at the input connector for converting an input voltage to the input current; and
   a current to voltage converter provided at the output connector for converting an output current to an output voltage.

2. The VGA of claim 1, further comprising a common mode feedback circuit.

3. The VGA of claim 1, further comprising means to switch off current sources that are conducted directly to a location where the current does not have any function in the circuitry.

4. A variable gain amplifier comprising:
   an input connector;
   an output connector;
   a gain adjustment connector adapted to generate a gain adjustment signal;
   scaled current mirrors for copying input current from the input connector;
   a steering mechanism adapted to steer the copied current to at least one of the output connector and another appropriate location based on the gain adjustment signal, wherein the steering mechanism comprises a plurality of differential pairs, each operatively coupled to a different one of the scaled current mirrors, and wherein different threshold reference voltages are provided to each of the differential pairs to enable them to be switched on one by one with increasing gain control voltage of the gain adjustment signal;
   a voltage to current converter provided at the input connector for converting an input voltage to the input current; and
   a current to voltage converter provided at the output connector for converting an output current to an output voltage.

5. The VGA of claim 4, further comprising a common mode feedback circuit.

6. The VGA of claim 5, further comprising means to switch off current sources that are conducted directly to a location where the current does not have any function in the circuitry.

* * * * *